United States Patent [19]

Tojo et al.

[11] Patent Number: 4,698,513
[45] Date of Patent: Oct. 6, 1987

[54] POSITION DETECTOR BY VIBRATING A LIGHT BEAM FOR AVERAGING THE REFLECTED LIGHT

[75] Inventors: Toru Tojo, Kanagawa; Mitsuo Tabata, Yokohama, both of Japan

[73] Assignee: Kabushiki Kaishi Toshiba, Kawasaki, Japan

[21] Appl. No.: 9,628

[22] Filed: Jan. 23, 1987

Related U.S. Application Data

[63] Continuation of Ser. No. 789,086, Oct. 18, 1985, abandoned.

[30] Foreign Application Priority Data

Mar. 15, 1985 [JP] Japan .................................. 60-51707
Mar. 15, 1985 [JP] Japan .................................. 60-51709

[51] Int. Cl.$^4$ ........................................... G01N 21/86
[52] U.S. Cl. ....................................... 250/561; 356/1
[58] Field of Search ............... 250/561, 563, 571, 235; 356/375, 1

[56] References Cited

U.S. PATENT DOCUMENTS 3,847,485 11/1974 Zanoni ................................ 356/167

FOREIGN PATENT DOCUMENTS 2157813 5/1973 Fed. Rep. of Germany .
2904833 5/1980 Fed. Rep. of Germany .
2445512 7/1980 France .
56-2632 1/1981 Japan .
56-101112 8/1981 Japan .
57-139607 8/1982 Japan .
0199902 12/1982 Japan .................................. 356/375
0226812 12/1984 Japan .................................. 356/375

Primary Examiner—Eugene R. LaRoche
Assistant Examiner—David Mis
Attorney, Agent, or Firm—Oblon, Fisher, Spivak, McClelland & Maier

[57] ABSTRACT

A device for measuring the position of an object has a light radiation mechanism for causing light to be obliquely incident on a surface of the object, a vibrating mechanism for vibrating the light incident on the surface of the object at a predetermined frequency, and a detecting mechanism for detecting light reflected by the surface of the object, generating a detection signal, and obtaining the position of the object in accordance with the detection signal.

19 Claims, 13 Drawing Figures

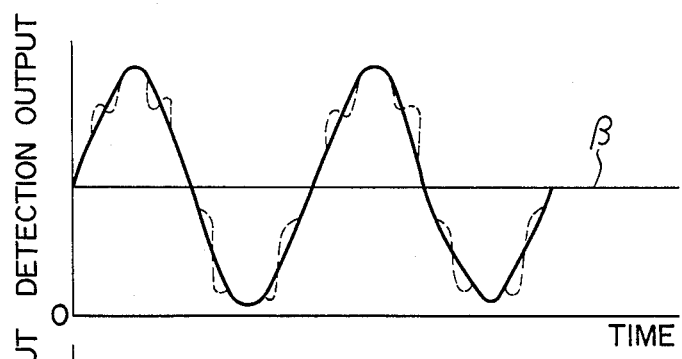
FIG. 6A
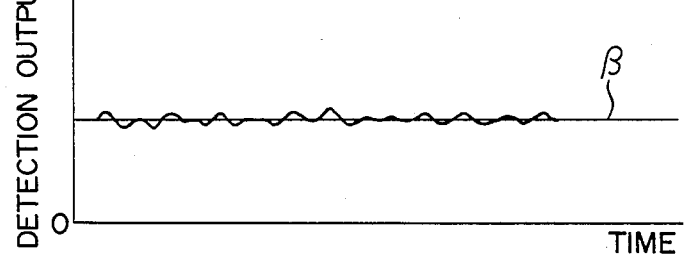
FIG. 6B
FIG. 7
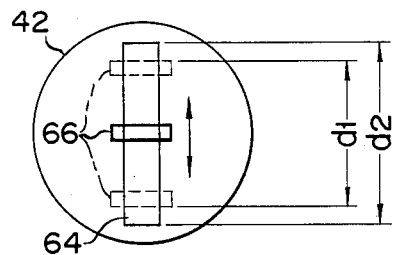

POSITION DETECTOR BY VIBRATING A LIGHT BEAM FOR AVERAGING THE REFLECTED LIGHT

This application is a continuation of application Ser. No. 789,086, filed Oct. 18, 1985, now abandoned.

BACKGROUND OF THE INVENTION

The present invention relates to a device for optically measuring the position of an object and, more particularly, to a device suitable for measuring the height of an object.

In an LSI manufacturing device such as an electron beam exposure device, the surface level of the object may vary with respect to the optical system due to warping of the sample or for other reasons when a pattern is drawn on a semiconductor wafer or a mask substrate. An error in the drawn pattern thus occurs. A conventional technique is employed to measure the variation along a direction perpendicular to the surface of the sample to correct the variation.

A technique using a device for measuring the surface level of an object is disclosed in Japanese Patent Laid-Open Publication (Kokai) No. 56-2632. With this device, light emitted from a laser source is focused to form a beam spot on the sample surface. Light reflected from the sample surface is focused by another lens on a semiconductor position sensor which uses a lateral photo effect. The detection output from the sensor is processed to measure the surface level of the sample.

In a surface level measuring device of this type, however, there is the following problem. When the sample surface has a portion with high reflectance and a portion with low reflectance, the intensity distribution of the beam is unbalanced due to the difference in reflectance as shown in FIG. 1, resulting in a measurement error. For example, when a PSD (Semiconductor Position Detector) which has been recently used in a variety of applications to measure the barycenter of the irradiation light intensity is used, the barycenter varies due to different beam intensities (FIG. 2A), as shown in FIG. 2B, thus resulting in a measuring error. On the other hand, when a vibration slit technique for a photoelectric microscope is used, a measuring error occurs due to nonuniform distribution of the beam spot.

SUMMARY OF THE INVENTION

It is an object of the present invention to provide a device for measuring the position of an object, wherein the measuring error caused by the difference between reflectances of portions of a surface-subjected to height measurement can be decreased.

The main feature of the present invention is that incident light is vibrated to average the measuring error so as to decrease the measuring error generated by nonuniform distribution of the beam reflected by the object surface. In order to achieve the above object of the present invention, there is provided a device for measuring the position of an object, comprising:

light radiation means for causing light to be obliquely incident on a surface of the object;

first vibrating means for vibrating the light incident on the surface of the object at a first frequency; and detecting means for detecting light reflected by the surface of the object, generating a detection signal, and obtaining the position of the object in accordance with the detection signal.

According to another aspect of the present invention, there is provided another means for vibrating the light reflected from the surface of the object. In this case, the positional variation of the reflected light which is caused on a detector by vibration of the incident light can be prevented.

According to the present invention, light incident on the surface of the object is vibrated to average a large number of measuring points on the surface thereof. As compared with a conventional device, the measuring error caused by the difference between the reflectances of the surface can be greatly decreased. According to the present invention, more accurate measurement can be performed merely by adding means for vibrating the incident light. When the light reflected by the surface of the object is vibrated, a decrease in dynamic range which is caused by vibration of the incident light can also be prevented.

BRIEF DESCRIPTION OF THE DRAWINGS

Other objects and advantages will be apparent from the following description taken in conjunction with the accompanying drawings, in which:

FIGS. 6A and 6B are graphs showing detection outputs from the devices of FIGS. 3 and 5, respectively;

FIG. 7 is a plan view of a PSD light-receiving surface for explaining the measuring range of the device of FIG. 5;

DETAILED DESCRIPTION OF THE PREFERRED EMBODIMENTS

Figure 1:
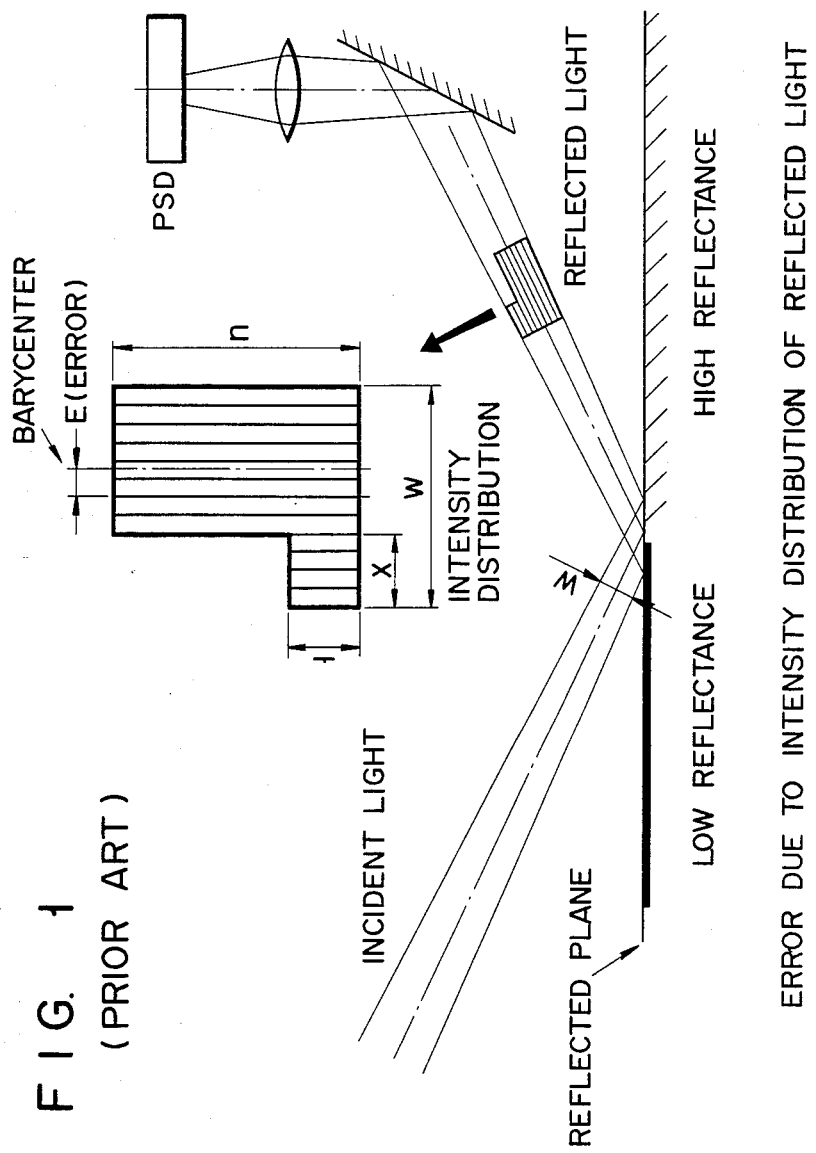
FIG. 1 shows the intensity distribution of reflected light and the measuring error which are caused by the difference in reflectance at different portions of an object.
Figures 2A, 2B:
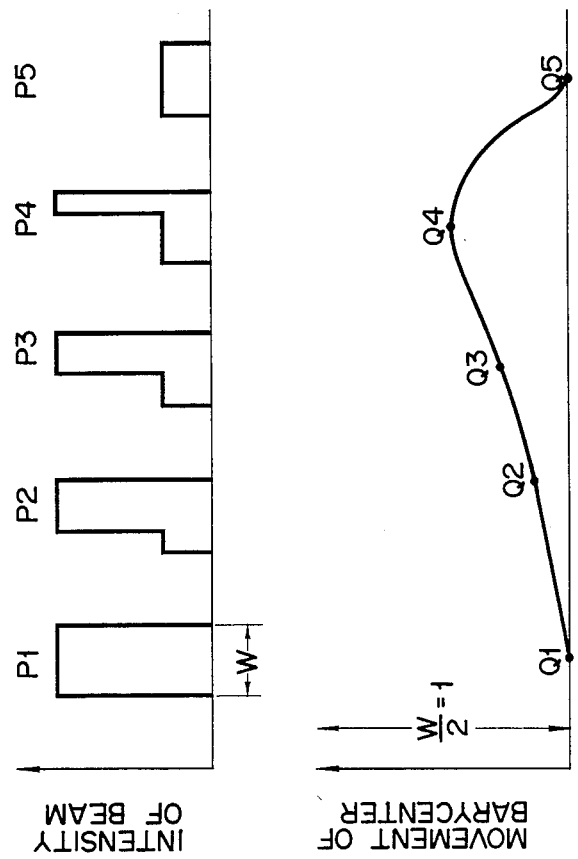
FIGS. 2A and 2B are graphs showing measurement results by a conventional measuring device.

A device for measuring the surface level of an object according to a first embodiment of the present invention will be described with reference to FIG. 3.

This embodiment exemplifies a device which is arranged in a chamber of an electron beam exposure apparatus to measure the level (height) of the object. Reference numeral 10 denotes a vacuum chamber constituting the sample chamber of the electron beam exposure apparatus. An electron-optical system (to be referred to as an EOS) 12 is mounted on the upper wall surface of the chamber 10. The EOS 12 comprises an electron gun, various lenses and various deflection systems (not shown). A sample 14 as an object placed in the chamber 10 is irradiated with an electron beam from the EOS 12.

A radiation system 16 and a light-receiving system 18 which constitute a device for measuring the height of the surface of the sample are arranged to the left and right, respectively, of the EOS 12. The system 16 comprises a laser 20, a slit 22, reflecting mirrors 24 and 26, a focusing lens 28, a reflecting mirror (vibrating mirror) 30, a vibrator 32 and a driving circuit 34. The laser beam emitted from the laser 20 passes through the slit 22 and is reflected by the reflecting mirrors 24 and 26. The reflected beam is focused by the lens 28 and is incident on the mirror 30. A focused beam 36 is reflected by the mirror 30 and is incident on the surface of the sample 14. The focused beam 36 is incident on the sample 14.

The mirror 30 has a vibrator 32 which comprises, for example, a piezoelectric element. The vibrator 32 is driven by the circuit 34. The frequency of the mirror 30 is sufficiently higher than the variation frequency of the surface level. The vibration amplitude of the mirror 30 can be determined by the length of the light-receiving surface (within an allowable tolerance) of a photosensor of a PSD 42 (to be described later).

The system 18 comprises a reflecting mirror 38, a focusing lens 40, a semiconductor position detector (PSD) 42 serving as a photosensor utilizing a known lateral photo effect, an adder 44, a subtracter 46, a divider 48, an average circuit 50 and a position measuring circuit 52. A reflected beam 54 upon radiation of the light 36 incident on the surface of the sample 14 is reflected by the mirror 38 and is focused on the light-receiving surface of the PSD 42 through the lens 40. The PSD 42 comprises a thin resistive film formed on a semiconductor substrate and output terminals formed at two ends of the thin resistive film. An imbalance signal appears at the pair of output terminals in accordance with the position of a beam spot formed on the thin resistive film of the PSD 42. A detection signal from the PSD 42 is processed by a signal processor consisting of the adder 44, the subtracter 46 and the divider 48. The processed signal is supplied to the circuit 50. The circuit 50 averages the input signal through, for example, a low-pass filter. The averaged signal (position signal) is supplied to the circuit 52. The circuit 52 calculates the position representing the surface level of the sample 14 in accordance with the input position signal.

Figure 4:
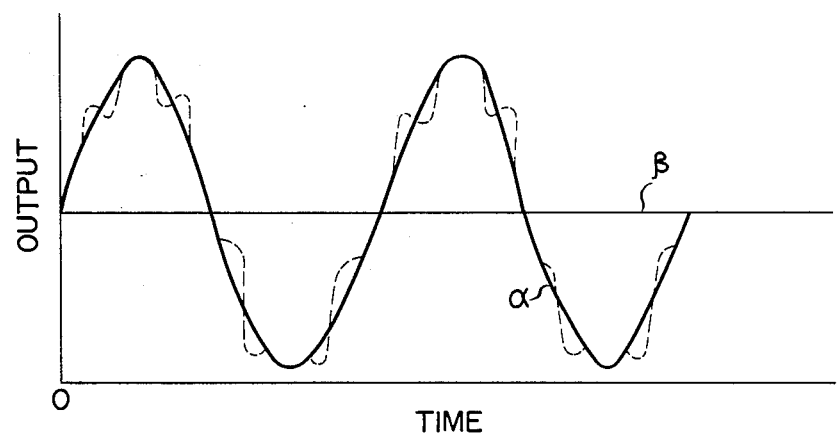
FIG. 4 is a graph showing the detection output and the average output which are obtained by the device of FIG. 3.

With the above arrangement, the detection output generated from the PSD 42 and the signal processor consisting of the components 44, 46 and 48 is a sine wave corresponding to the frequency and amplitude of the mirror 30, as indicated by a curve $\alpha$ of FIG. 4. In this case, when the beam passes through a portion with different deflectance, an error signal indicated by the broken line is generated. When the error signal is averaged through the filter in the simplest manner, the error signal can be averaged throughout the frequency and amplitude, as indicated by a line $\beta$. Therefore, unlike when the incident light is not vibrated, the error can be greatly decreased. Since the incident angle of the incident light 36 is vibrated to average a large number of measuring points on the sample, the measurement error can be greatly decreased compared with the conventional system.

According to this embodiment, the incident light 36 is vibrated to greatly decrease the measurement error caused by the difference in reflectance at different portions of the sample surface. For this reason, the height measurement of the sample surface can be performed with high precision. As compared with the conventional system, high-precision measurement can be realized simply by providing a mirror vibrating mechanism.

Now, in the first embodiment, the incident light 36 is vibrated in a plane of incidence. The incident light 36, however, may be vibrated in any direction, for example, 45° with regard to the plane of incidence.

A position measuring device according to a second embodiment of the present invention will be described with reference to FIG. 5.

Figure 3:
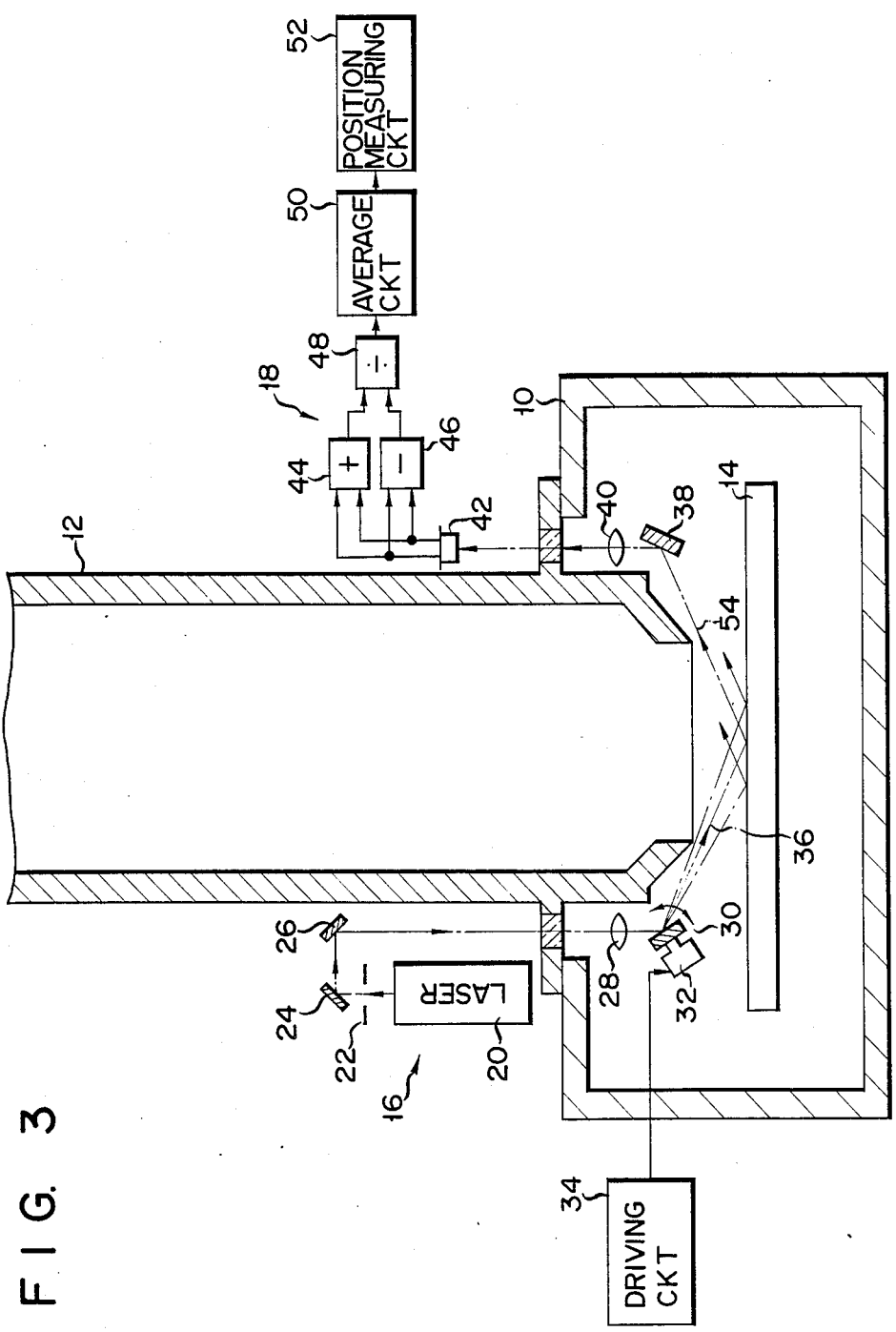
FIG. 3 is a schematic diagram showing a position measuring device according to a first embodiment of the present invention.
Figure 5:
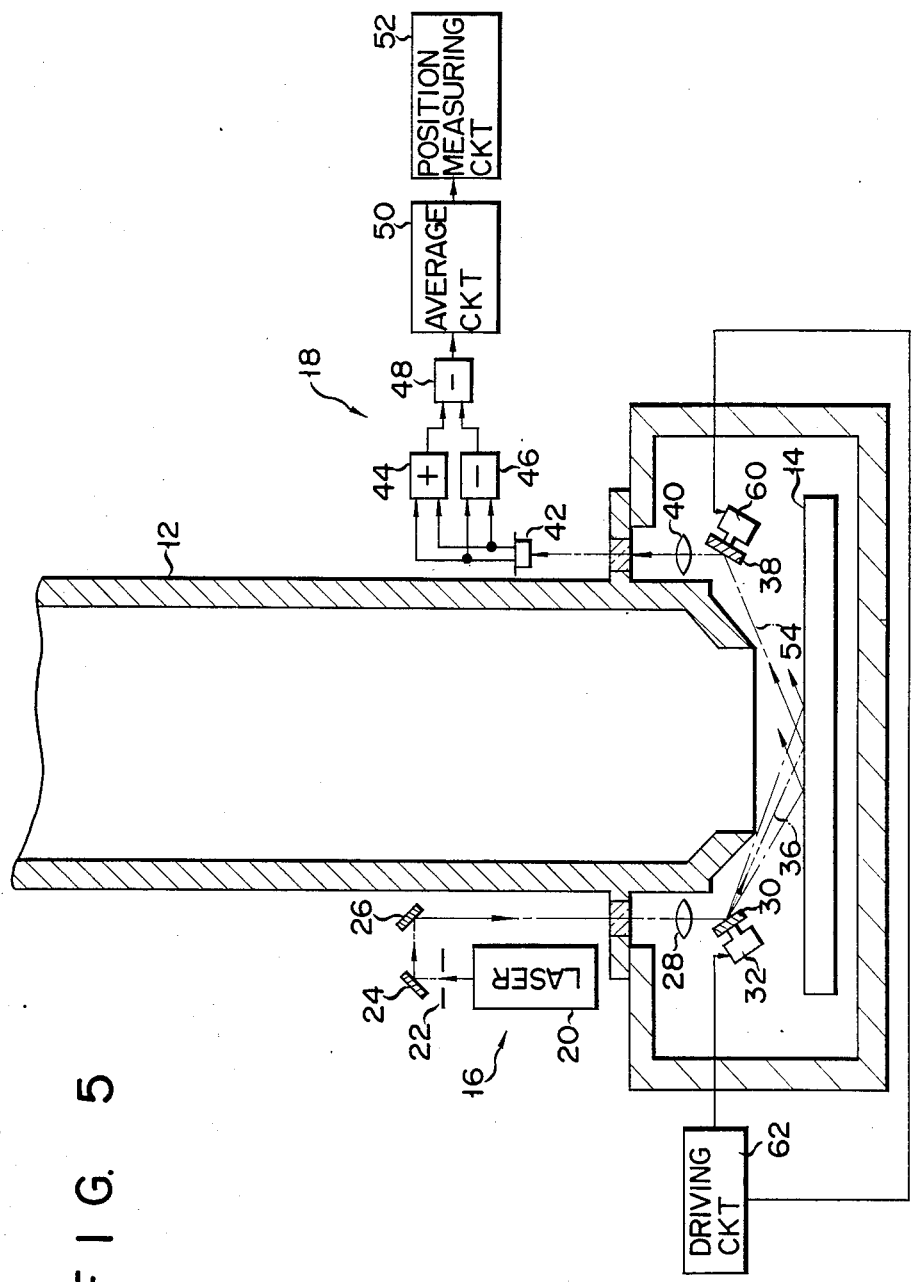
FIG. 5 is a schematic diagram of a position measuring device according to a second embodiment of the present invention.

The same reference numerals in the second embodiment of FIG. 5 denote the same parts as in FIG. 3, and a detailed description thereof will be omitted. The device of the second embodiment is substantially the same as that of the first embodiment except that mirrors 30 and 38 are vibrated. More particularly, the mirror 38 is mounted on a vibrator 60 driven by a driving circuit 62. The vibration phase of the mirror 38 is exactly opposite to that of the mirror 30. The vibration amplitude is determined to cancel the optical magnification factor. The vibration of the reflected beam on the PSD 42 which is caused by vibration of the incident light 36 is cancelled by vibration of the mirror 38. Even if the incident light 36 is vibrated, the position of the reflected light 54 on the PSD 42 is not changed.

With the above arrangement, the vibration caused by the vibration of the incident light 36 is cancelled by the vibration of the reflected light 54. A change in position of the beam spot along a direction perpendicular to the sample surface appears on the PSD 42. When the reflected light 54 is not vibrated, a vibration component of the incident light 36 is included in the detection output, as shown in FIG. 6A. However, when the reflected light 54 is vibrated, the vibration component of the incident light 36 is not included in the detection output, as shown in FIG. 6B. A shift of the light spot on the PSD 42 shows a change along a direction perpendicular to the sample surface, so that the measurement dynamic range of the detector can be increased, and a corresponding small detector can be used. As a result, the resolution of the detector can be increased.

More specifically, in the device of FIG. 3, the light beam is deviated, as indicated by d1 of FIG. 7, at the detector (PSD) side due to the vibration of the incident light 36. Referring to FIG. 7, reference numeral 64 denotes a light-receiving surface of the PSD 42; and 66, a focused light beam of the reflected light 54. An output signal from the PSD 42 passes through a signal processor and is averaged through a filter, and accurate coordinates are calculated. In order to increase displacement sensitivity along a direction perpendicular to the sample surface, the light beam at the detector side must be magnified by the optical magnification factor. In this case, even if the incident light 36 is slightly vibrated, the light beam is vibrated throughout a measurement range d2 of the detector. When a large detector is used, the above problem can be solved. However, the measurement resolution may then be degraded. From this point of view, a large detector cannot be used without taking this into consideration. It is thus difficult to increase the measurement dynamic range.

According to this embodiment, however, the reflected light 54 is synchronously vibrated with the incident light 36 in opposite phases. Even if the incident light 36 is vibrated, the light beam within the measurement range d2 of the detector will not be shifted. In other words, a specific position of the light-receiving surface 64 can be used for measurement. The second embodiment has the same effect as in the first embodiment. In addition, the measurement dynamic range can be increased.

A sample surface height measuring device according to a third embodiment of the present invention will be described with reference to FIG. 8.

Reference numeral 120 denotes a light source. Light from the light source 120 passes through a slit 122 and is incident on a vibrating mirror 130. The mirror 130 is mounted on a vibrator 132 which comprises a piezoelectric element or utilizes an electromagnetic force. The vibrator 132 is driven by a driving circuit 134. The mirror 130 is vibrated at a frequency f1 in the A direction.

The light reflected by the mirror 130 is focused by a focusing lens 128. Focused light (i.e., incident light) 136 is incident on the surface of a sample 114 placed on a sample table 115. Light 154 reflected by the surface of the sample 114 is focused by a focusing lens 140 and is incident on a mirror 138. Light reflected by the mirror 138 is incident on the light-receiving surface of a photodetector 172 through a slit 170.

The slit 170 is mounted on a vibrator 174 which vibrates in response to an oscillation output from an oscillator (OSC) 176. Upon vibration of the vibrator 174, the slit 170 is vibrated in the B direction. A frequency f2 of the slit 170 is lower than the frequency f1.

A detection signal from the photodetector 172 is amplified by a preamplifier (AMP) 178 and is supplied to a synchronous detection circuit 182 through a bandpass filter (BPF) 180. The pass band of the BPF 180 corresponds to the frequency f2 of the slit 170. The circuit 182 receives the oscillation output from the OSC 176 and synchronously detects the detection signal. That is, the circuit 182 detects a signal from the photodetector 172 in synchronism with vibration of the slit 170. An output (position signal) from the circuit 182 is supplied to a position measuring circuit 152. The circuit 152 calculates a surface level of the sample 114 in accordance with the input position signal.

With the above arrangement, the surface level of the sample 114 can be measured in the same manner as in a vibration slit technique. Furthermore, since the incident light 136 is vibrated, a measurement can be performed at a large number of measuring points on the surface of the sample 114. As compared with the conventional system, the measuring error can be greatly decreased. The bad influence of the vibration of the incident light 136 is an incident light frequency component which is left unfiltered by the BPF 180 and the circuit 182. However, this component can be easily decreased by setting the ratio of f1 to f2 to be larger than 1.

According to this embodiment, the incident light 136 is vibrated to greatly decrease the measuring error caused by the difference in reflectance on the surface of the sample. Therefore, high-precision measurement can be performed, and the device can be realized only by adding a mirror (130) vibrating mechanism to the conventional system.

A position measuring device according to a fourth embodiment of the present invention will be described with reference to FIG. 9.

Figure 8:
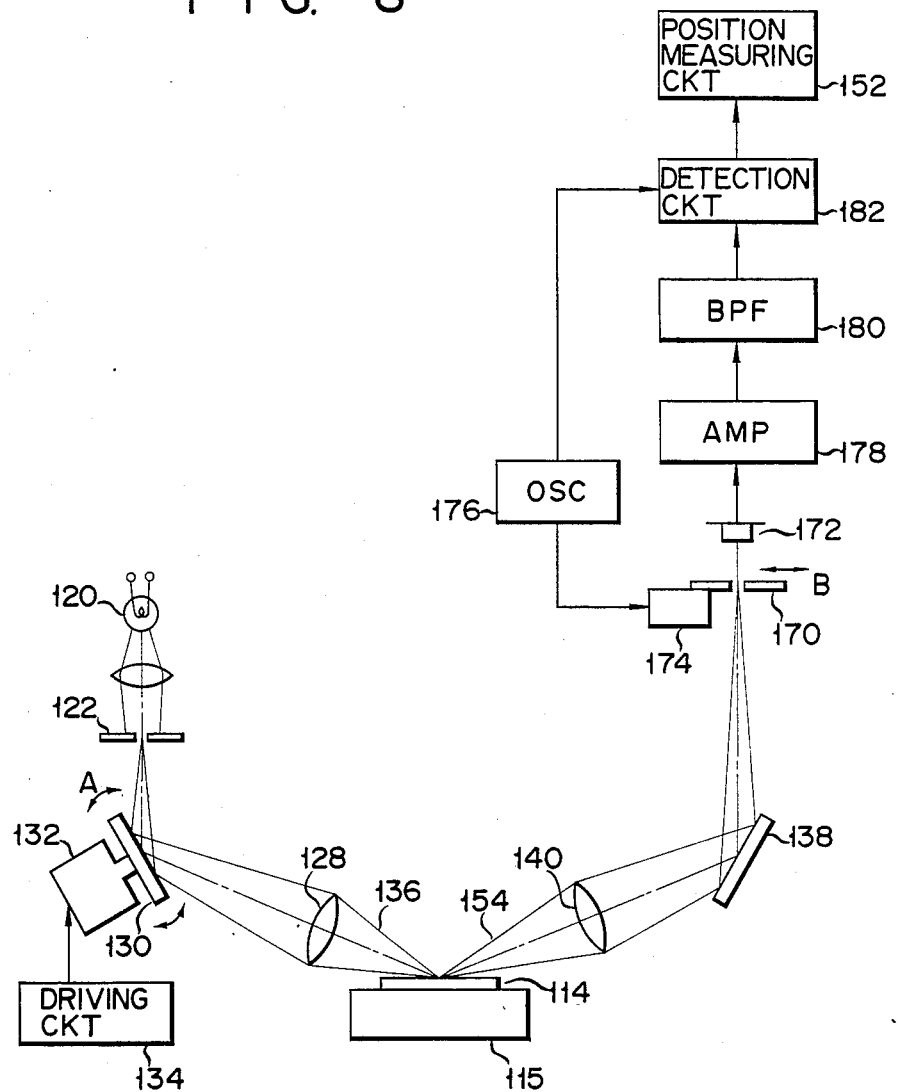
FIG. 8 is a schematic diagram of a position measuring device according to a third embodiment of the present invention.
Figure 9:
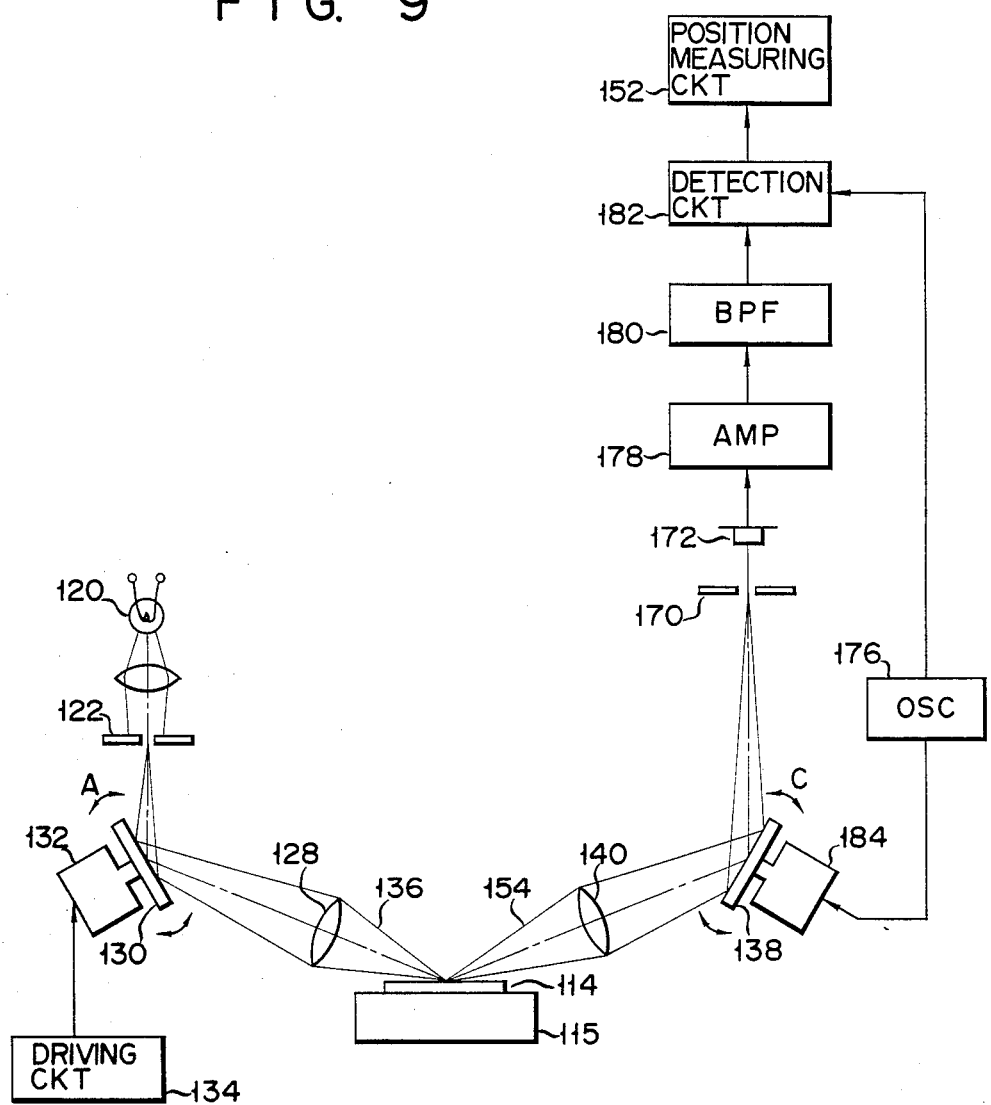
FIG. 9 is a schematic diagram of a position measuring device according to a fourth embodiment of the present invention.

The same reference numerals in FIG. 9 denote the same parts as in FIG. 8, and a detailed description thereof will be omitted. The device of the fourth embodiment is substantially the same as that of the third embodiment except that a mirror 138 in place of the slit 170 is vibrated. The mirror 138 is mounted on a vibrator 184, and the vibrator 184 is driven in accordance with an oscillation output from an OSC 176. Upon vibration of the vibrator 184, the mirror 138 is vibrated at a frequency f2 in the C direction. Note that the slit 170 is fixed.

With the above arrangement, a change in amount of light passing through the slit 170 on the basis of the relative positional relationship between reflected light 154 and the slit 170 is the same as that in the third embodiment. Therefore, the fourth embodiment has the same effect as in the third embodiment.

A position measuring device according to a fifth embodiment of the present invention will be described with reference to FIG. 10.

Figure 10:
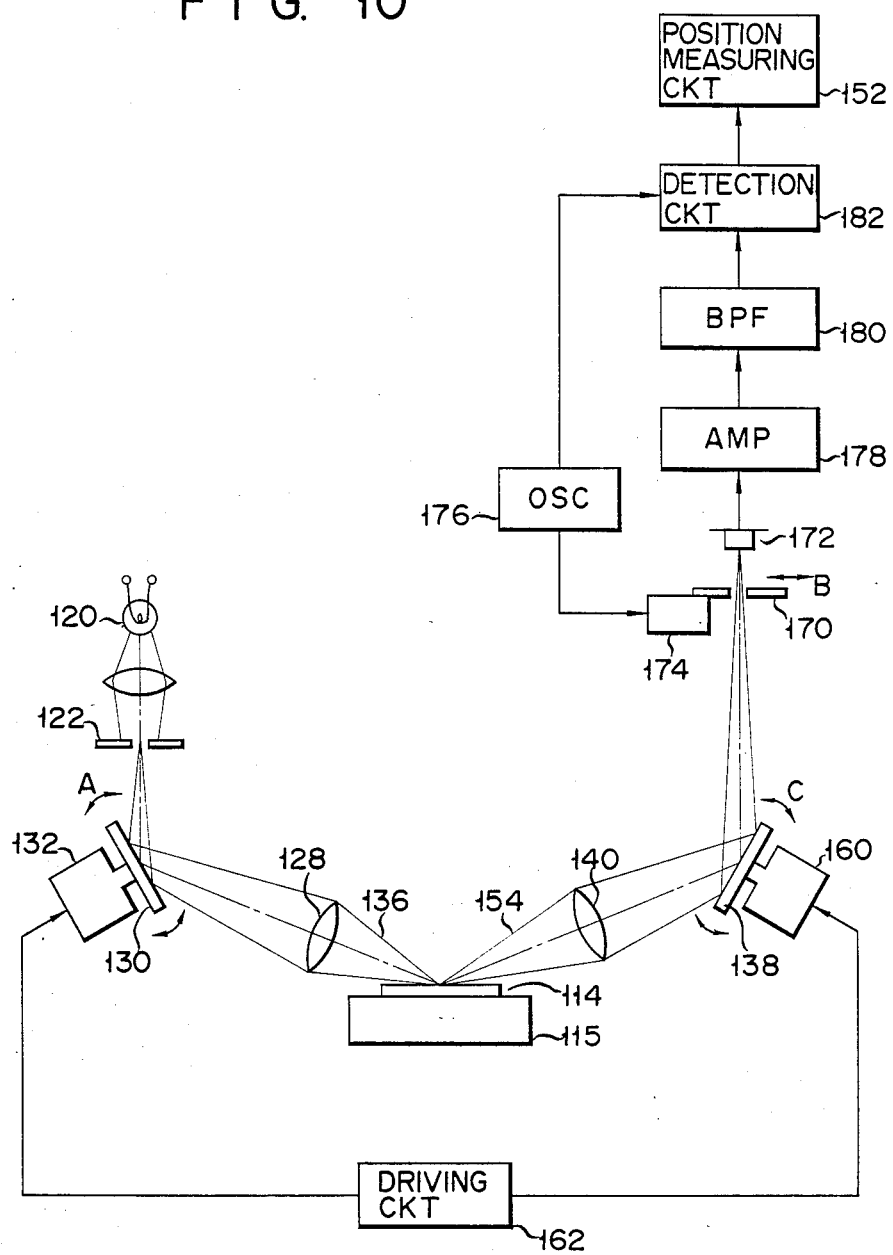
FIG. 10 is a schematic diagram of a position measuring device according to a fifth embodiment of the present invention.

The same reference numerals in FIG. 10 denote the same parts as in FIG. 8, and a detailed description thereof will be omitted. The device of the fifth embodiment is substantially the same as that of the third embodiment except that both incident light 136 and reflected light 154 are vibrated. A mirror 138 is mounted on a vibrator 160, and the vibrator 160 and a vibrator 132 are driven by a driving circuit 162. Upon vibration of the vibrator 160, the mirror 138 is vibrated in the C direction. The frequency of the vibrator 160, i.e., the frequency of the reflected light 154 is the same as a frequency f1 of the incident light 136. The phase of the light 154 is accurately opposite to that of the light 136, so that the vibration of the incident light 136 is cancelled by that of the reflected light 154.

With this arrangement, the vibration component of the incident light 136 is cancelled by vibration correction of the reflected light 154. A shift of the light beam along a direction perpendicular to the sample surface appears on the detector 172. In other words, when the reflected light 154 is not vibrated, the vibration component of the incident light 136 is included in the detection output; however, when the reflected light 154 is vibrated, the vibration component is not included therein. Therefore, a shift of the light beam on the detector 172 shows a change along a direction perpendicular to the sample surface, thereby increasing the measurement dynamic range of the detector. Then, a small detector can be used, and the resolution of the detector can be improved.

A position measuring device according to a sixth embodiment of the present invention will be described with reference to FIG. 11.

Figure 11:
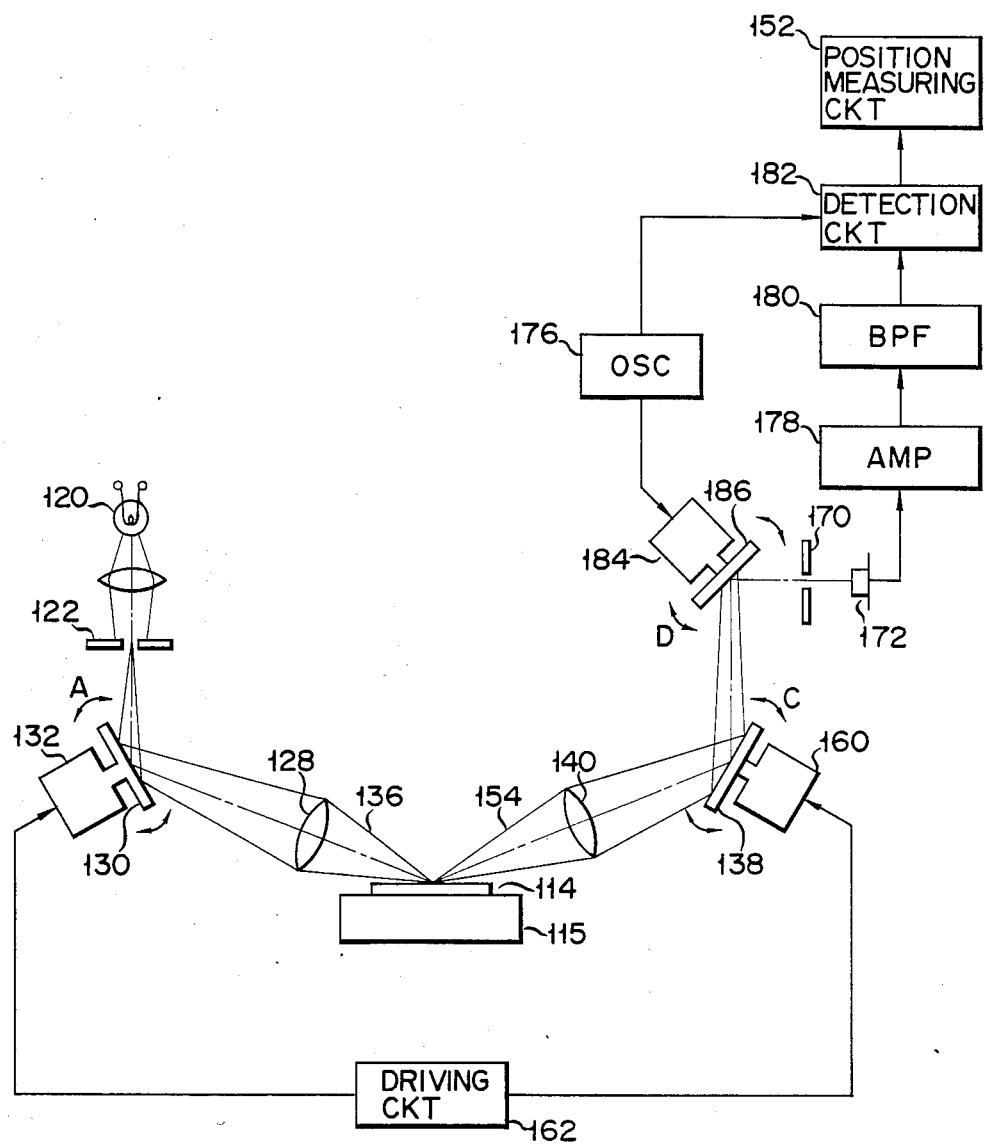
FIG. 11 is a schematic diagram of a position measuring device according to a sixth embodiment of the present invention.

The same reference numerals in FIG. 11 denote the same parts as in FIG. 10, and a detailed description thereof will be omitted. The device of the sixth embodiment is substantially the same as that of the fifth embodiment except that reflected light 154 in place of a slit 170 is vibrated. The beam reflected by a mirror 138 is reflected again by a vibrating mirror 186. The reflected light passes through the slit 170 and is incident on a photodetector 172. The vibrating mirror 186 is mounted on a vibrator 184, and the vibrator 184 is vibrated in accordance with an oscillation output from an OSC 176. The mirror 186 is vibrated at a frequency f2 in the D direction.

With the above arrangement, a change in amount of light passing through the slit 170 on the basis of the relative positional relationship between the reflected light 154 and the slit 170 is the same as that of the fifth embodiment. The sixth embodiment has the same effect as that of the fifth embodiment.

The present invention is not limited to the particular embodiments described above. For example, the incident light is not limited to slit-like focused light, but can extend to circular spot light. For the means for mechanically vibrating the incident light to be incident on the surface of the sample, an acoustic means using an acousto-optical deflector or a means using an electro-optical deflector may be utilized. Furthermore, the mechanical driving system may use a piezoelectric element or an electromagnetic element such as a magnet. Instead of changing the incident angle, a plane parallel is used to translate the incident light position, thereby vibrating the light.

The average circuit may be connected to the input terminal of the divider or the input/output terminal of the adder/substracter.

The frequencies f1 and f2 can be arbitrarily determined in accordance with specifications. Preferably, the frequency f1 for vibrating the incident light is sufficiently higher than the frequency f2 of the slit or the reflected light equivalent to the slit.

The above embodiments exemplify height measurement of the sample surface. However, the present invention can also be applied to position measurement for width, length, distance or the like. Simple signal processing is performed by using a low-pass filter. However, signal processing may, for example, be performed by using a digital filter. When the vibration amplitude is increased, the error can be decreased. However, the vibration amplitude may be determined for each given system. The vibration waveform is not limited to a sine wave, but can extend to a triangular or saw-tooth wave or the like. The light source may be a continuous ON light source or a light source for emitting a modulated beam. In addition, the position measuring circuit need not be used. In this case, the output from the average circuit can be directly supplied to the height control mechanism.

What is claimed is:

1. A device for measuring the position of an object, comprising:
   light beam radiation means for causing a light beam to be obliquely incident on a surface of the object;
   first vibrating means for vibrating said light beam incident on the surface of the object to scan the same at a first frequency;
   detecting means including photodetecting means for detecting a reflected light beam reflected from the surface of the object and generating a detection signal representing a position of the object; and
   means for obtaining the position of the object in accordance with the detection signal, which includes a processing means for averaging the detection signal and calculating the position of the object.

2. The device according to claim 1, wherein said photodetecting means comprises a semiconductor position detector element which utilizes a lateral photo effect.

3. The device according to claim 1, wherein said first vibrating means includes:
   a mirror element for reflecting the light beam from said radiation means and onto the surface of the object; and
   a piezoelectric element for vibrating said mirror element.

4. The device according to claim 1, wherein said processing means has a low-pass filter.

5. The device according to claim 1, which further comprises second vibrating means for vibrating the light beam reflected by the surface of the object at a second frequency.

6. The device according to claim 5, wherein said photodetectingmeans is provided for detecting the light beam reflected from the surface of the object according to the detected light beam which has passed through said first and second vibrating means.

7. The device according to claim 6, wherein the vibration of the incident light beam by said first vibrating means has a phase opposite to that of the reflected light beam vibrated by said second vibrating means.

8. The device according to claim 6, wherein the reflected light beam vibrated by said second vibrating means has an amplitude which is cancelled by that of the incident light beam vibrated by said first vibrating means, so that the position of the reflected light beam on said photodetecting means is not changed.

9. The device according to claim 6, wherein said photodetecting means comprises a semiconductor position detector element which utilizes a lateral photo effect.

10. The device according to claim 6, wherein said first vibrating means includes:
    a mirror element for reflecting the light beam from said radiation means and directing the light beam on the surface of the object; and
    a piezoelectric element for vibrating said mirror element.

11. The device according to claim 6, wherein said second vibrating means includes:
    a mirror element for reflecting the reflected light beam from the surface of the object and causing the reflected light beam to be incident on said photodetecting means; and
    a piezoelectric element for vibrating said mirror element.

12. The device according to claim 6, wherein said processing means has a low-pass filter.

13. The device according to claim 1 wherein a slit element for slitting the reflected light beam reflected by the surface of the object upon radiation is provided in said detecting means, said photodetecting means is provided for detecting the light beam which has passed through said slit element, said detecting means further including:
    second vibrating means for vibrating said slit element at a second frequency different from the first frequency;
    detecting device for detecting the detection signal from said photodetecting means in synchronism with the vibration of said slit element and generating a detection signal; and
    said processing means is provided for calculating the position of the surface of the object in accordance with the detection signal.

14. The device according to claim 13, wherein the second frequency is lower than the first frequency.

15. The device according to claim 13, wherein said detecting means further includes a filter element for receiving the detection signal from said photodetecting means.

16. The diveic according to claim 1 wherein:
    a slit element for slitting the reflected light beam reflected by the surface of the object is provided in said detecting means;

said photodetecting means is provided for detecting the light beam passed through said slit element;

said detecting means further includes:

second vibrating means for vibrating the reflected light beam from the object at a second frequency different from the first frequency;

detecting device for detecting the detection signal from said photodetecting means in synchronism with the vibration of the reflected light beam from the object and generating a detection signal; and said processing means is provided for calculating the position of the surface of the object in accordance with the detection signal.

17. The device according to claim 16, wherein the second frequency is lower than the first frequency.

18. The device according to claim 16, which further comprises third vibrating means for vibrating the reflected light beam from the surface of the object at the first frequency and causing the reflected light beam to be incident on said slit element.

19. The device according to claim 18, wherein the second frequency is lower than the first frequency.

* * * * *